(12) United States Patent
Chen et al.

(10) Patent No.: US 10,797,067 B2
(45) Date of Patent: Oct. 6, 2020

(54) THREE-DIMENSIONAL MEMORY DEVICE AND FABRICATING METHOD THEREOF

(71) Applicant: Yangtze Memory Technologies Co., Ltd., Wuhan, Hubei (CN)

(72) Inventors: Ziqi Chen, Hubei (CN); Guanping Wu, Hubei (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 0 days.

(21) Appl. No.: 16/046,679

(22) Filed: Jul. 26, 2018

(65) Prior Publication Data
US 2019/0067322 A1    Feb. 28, 2019

Related U.S. Application Data

(63) Continuation of application No. PCT/CN2018/087158, filed on May 16, 2018.

(30) Foreign Application Priority Data

Aug. 31, 2017  (CN) .......................... 2017 1 0773927

(51) Int. Cl.
*H01L 27/11582* (2017.01)
*H01L 21/033* (2006.01)
(Continued)

(52) U.S. Cl.
CPC .... *H01L 27/11582* (2013.01); *H01L 21/0273* (2013.01); *H01L 21/0332* (2013.01);
(Continued)

(58) Field of Classification Search
None
See application file for complete search history.

(56) References Cited

U.S. PATENT DOCUMENTS 8,878,278 B2   11/2014  Alsmeier et al.
9,093,369 B2    7/2015  Shin et al.
(Continued)

FOREIGN PATENT DOCUMENTS

CN   103490008 A    1/2014
CN   104205342 A   12/2014
(Continued)

OTHER PUBLICATIONS

International Search Report and Written Opinion of the International Searching Authority directed to related International Patent Application No. PCT/CN2018/087158, dated Aug. 16, 2018; 7 pages.

*Primary Examiner* — Grant S Withers
(74) *Attorney, Agent, or Firm* — Sterne, Kessler, Goldstein & Fox P.L.L.C.

(57) ABSTRACT

Embodiments of through array contact structures of a 3D memory device and fabricating method thereof are disclosed. The method comprises: forming a recess region in a substrate including multiple protruding islands; forming a gate dielectric layer to cover top surfaces and sidewalls of the multiple protruding islands and a top surface of the recess region of the substrate; forming an underlying sacrificial layer on the gate dielectric layer to surround the sidewalls of the multiple protruding islands; forming an alternating dielectric stack including multiple alternatively stacked insulating layers and sacrificial layers on the underlying sacrificial layer and the multiple protruding islands; forming multiple channel holes penetrating the alternating dielectric stack, each channel hole is located corresponding to one of the multiple protruding islands; and forming a memory layer in each channel hole, wherein a channel layer of the memory layer is electrically connected with a corresponding protruding island.

10 Claims, 17 Drawing Sheets

(51) Int. Cl.
*H01L 21/027* (2006.01)
*H01L 21/311* (2006.01)
*H01L 21/3105* (2006.01)
*H01L 29/10* (2006.01)
*H01L 21/768* (2006.01)
*H01L 21/28* (2006.01)
*H01L 21/02* (2006.01)

(52) U.S. Cl.
CPC .... *H01L 21/0337* (2013.01); *H01L 21/31053* (2013.01); *H01L 21/31111* (2013.01); *H01L 21/31144* (2013.01); *H01L 21/76802* (2013.01); *H01L 21/76877* (2013.01); *H01L 29/1037* (2013.01); *H01L 29/40117* (2019.08); *H01L 21/0206* (2013.01); *H01L 21/0217* (2013.01); *H01L 21/02164* (2013.01); *H01L 21/02532* (2013.01); *H01L 21/02595* (2013.01); *H01L 21/02636* (2013.01); *H01L 21/31116* (2013.01)

(56) References Cited

U.S. PATENT DOCUMENTS

| | | | |
|---|---|---|---|
| 9,460,931 B2 | 10/2016 | Pachamuthu et al. | |
| 10,020,314 B1* | 7/2018 | Baraskar | H01L 27/1157 |
| 10,079,244 B2 | 9/2018 | Ramaswamy et al. | |
| 2002/0006699 A1 | 1/2002 | Noble et al. | |
| 2008/0315291 A1 | 12/2008 | Kito et al. | |
| 2012/0009747 A1 | 1/2012 | Kang et al. | |
| 2013/0248974 A1 | 9/2013 | Alsmeier et al. | |
| 2013/0328005 A1 | 12/2013 | Shin et al. | |
| 2014/0284697 A1 | 9/2014 | Wang et al. | |
| 2016/0056302 A1 | 2/2016 | Bin et al. | |
| 2016/0307916 A1 | 10/2016 | Chen et al. | |
| 2017/0018565 A1* | 1/2017 | Nishida | H01L 27/11582 |
| 2017/0271362 A1* | 9/2017 | Sonehara | H01L 27/11582 |
| 2019/0006383 A1* | 1/2019 | Matsuno | H01L 27/11582 |
| 2019/0067323 A1* | 2/2019 | Xu | H01L 27/11582 |
| 2019/0287992 A1* | 9/2019 | Sato | H01L 27/11556 |

FOREIGN PATENT DOCUMENTS

| | | |
|---|---|---|
| CN | 105261629 A | 1/2016 |
| CN | 107564915 A | 1/2018 |
| TW | 200939405 A | 9/2009 |
| TW | 201721842 A | 6/2017 |
| WO | WO-2019/041892 A1 | 3/2019 |

\* cited by examiner

THREE-DIMENSIONAL MEMORY DEVICE AND FABRICATING METHOD THEREOF

CROSS-REFERENCE TO RELATED APPLICATIONS

This application claims priority to PCT/CN2018/087158 filed on May 16, 2018, which claims priority to Chinese Patent Application No. 201710773927.2 filed on Aug. 31, 2017, the entire contents of which are incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of 3D memory devices and fabrication methods thereof are disclosed herein.

Disclosed is a method for forming a three-dimensional (3D) NAND memory device, comprising: forming a recess region in a substrate including a plurality of protruding islands; forming a gate dielectric layer to cover top surfaces and sidewalls of the plurality of protruding islands and a top surface of the recess region of the substrate; forming an underlying sacrificial layer on the gate dielectric layer to surround the sidewalls of the plurality of protruding islands; forming an alternating dielectric stack including a plurality of alternatively stacked insulating layers and sacrificial layers on the underlying sacrificial layer and the plurality of protruding islands; forming a plurality of channel holes penetrating the alternating dielectric stack, each channel hole is located corresponding to one of the plurality of protruding islands; and forming a memory layer in each channel hole, wherein a channel layer of the memory layer is electrically connected with a corresponding protruding island.

In some embodiments, forming the recess region in the substrate including the plurality of protruding islands comprises: forming a hard mask layer on the substrate; forming a patterned photoresist layer on the hard mask layer; using the patterned photoresist layer as a mask to pattern the hard mask layer; and using the patterned hard mask layer as a mask to etch the substrate to form the recess region including the plurality of protruding islands.

In some embodiments, forming the recess region in the substrate including the plurality of protruding islands comprises: etching the substrate to form the recess region including an array of protruding islands.

In some embodiments, forming the underlying sacrificial layer on the gate dielectric layer to surround the sidewalls of the plurality of protruding islands comprises: filling the underlying sacrificial layer to bury the plurality of protruding islands; planarizing the underlying sacrificial layer; and removing a top portion of the underlying sacrificial layer, such that a top surface of the remaining underlying sacrificial layer is lower than the top surfaces of the plurality of protruding islands.

In some embodiments, forming the alternating dielectric stack on the underlying sacrificial layer and the plurality of protruding islands comprises: depositing a first insulating layer on the underlying sacrificial layer to bury the plurality of protruding islands; planarizing the first insulating layer, such that a top surface of the remaining first insulating layer is higher than the top surfaces of the plurality of protruding islands; and forming a plurality of alternating sacrificial layers and insulating layers on the first insulating layer.

In some embodiments, forming the memory layer in each channel hole comprises: forming a charge trapping layer on a sidewall of each channel hole; forming a channel layer in contact with a protruding island on a sidewall of the charge trapping layer; and forming an insulation filling layer to fill a gap in the channel layer.

In some embodiments, the method further comprises replacing the underlying sacrificial layer and the sacrificial layers in the alternating dielectric stack with conductor layers.

In some embodiments, replacing the underlying sacrificial layer and the sacrificial layers in the alternating dielectric stack with conductor layers comprises: forming one or more slits vertically penetrating the alternating dielectric stack; etching the underlying sacrificial layer and the sacrificial layers through the one or more slits; and filling a conductor material into the gaps between the insulating layers.

In some embodiments, etching the underlying sacrificial layer and the sacrificial layers through the one or more slits comprises: filling an acid liquid having a high selectivity ratio between the insulating layers and the sacrificial layers into the one or more slits.

In some embodiments, the method further comprises forming a drain contact at a top portion of each channel hole, such that the protruding island acts as a channel region of a source line selector at a bottom portion of each channel hole.

Another aspect of the present disclosure provides a three-dimensional (3D) NAND memory device, comprising: a substrate including a plurality of protruding islands in a recess region of the substrate; a gate dielectric layer covering top surfaces and sidewalls of the plurality of protruding islands and a top surface of the recess region of the substrate; an underlying conductor layer on the gate dielectric layer to surround the sidewalls of the plurality of protruding islands; an alternating conductor/dielectric stack including a plurality of alternatively stacked insulating layers and conductor layers on the underlying conductor layer and the plurality of protruding islands; a plurality of channel holes vertically penetrating the alternating conductor/dielectric stack, each channel hole is above one protruding island; and a memory layer in each channel hole, wherein a channel layer of the memory layer is electrically connected with a corresponding protruding island.

In some embodiments, the plurality of protruding islands is formed by etching the substrate.

In some embodiments, the plurality of protruding islands is arranged in an array.

In some embodiments, a height of the underlying conductor layer is lower than a height of each protruding island.

In some embodiments, a top surface of the underlying conductor layer is lower than a top surface of each protruding island.

In some embodiments, a top surface of each protruding island is lower than a top surface of a lowest insulating layer in the alternating conductor/dielectric stack.

In some embodiments, the insulating layers comprise silicon oxide.

In some embodiments, the underlying conductor layer and the conductor layers comprise tungsten.

In some embodiments, the memory layer in each channel hole comprises: a charge trapping layer on a sidewall of each channel hole; a channel layer in contact with a protruding island on a sidewall of the charge trapping layer; and an insulation filling layer filling a gap in the channel layer.

In some embodiments, the device further comprises a drain contact at a top portion of each channel hole. The protruding island acts as a channel region of a source line selector at a bottom portion of each channel hole.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
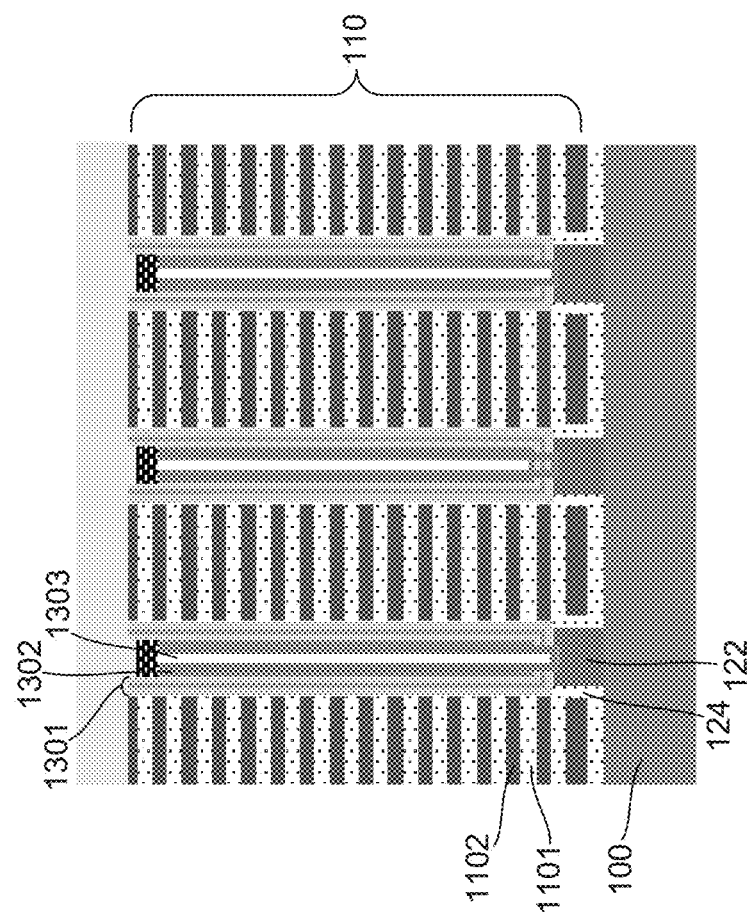
FIG. 1 illustrates a schematic cross-sectional view of an exemplary 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

As shown in FIG. 1, a schematic cross-sectional view of an exemplary 3D memory device is illustrated. The 3D memory device can be a 3D NAND memory device including an alternating conductor/dielectric stack 110 disposed on a substrate 100. The alternating conductor/dielectric stack can include a plurality of conductor/dielectric layer pairs. The number of the conductor/dielectric layer pairs in alternating conductor/dielectric stack 110 (e.g., 32, 64, or 96) can set the number of memory cells in the 3D memory device. Dielectric layers 1101 and conductive layers 1101 in alternating conductor/dielectric stack 110 can alternate in the vertical direction. In other words, except the ones at the top or bottom of alternating conductor/dielectric stack 110, each conductive layer 1102 can be adjoined by two dielectric layers 1101 on both sides, and each dielectric layer 1101 can be adjoined by two conductive layers 1102 on both sides.

Dielectric layers 1101 can include dielectric materials including, but not limited to, silicon oxide, silicon nitride, silicon oxynitride, or any combination thereof. Conductive layers 1102 can include conductive materials including, but not limited to, tungsten (W), cobalt (Co), copper (Cu), aluminum (Al), polycrystalline silicon (polysilicon), doped silicon, silicides, or any combination thereof. In some embodiments, conductive layers 1102 include metal layers, such as W, and dielectric layers 1101 include silicon oxide.

In some embodiments, a plurality of channel holes can be formed in the alternating conductor/dielectric stack 110. An epitaxial layer 122 can be formed at the bottom of each channel hole. A gate dielectric layer 124 can be formed to enclose the sidewall of the epitaxial layer 122. A memory layer including a charge trapping layer 1301 and a channel layer 1302 can be formed above the epitaxial layer 122. A filling layer 1303 can be formed inside of the memory layer. In some embodiments, the charge trapping layer 1301 can have an oxide-nitride-oxide (ONO) structure, the channel layer 1302 can be a polycrystalline silicon (polysilicon) layer, and the filling layer 1303 can be an oxide layer.

A string of memory cells can be formed vertically in each channel hole. For each string of memory cells, each conductor layer 1102 can be used a control gate. The epitaxial layer 122 at the bottom of the channel hole can be used as a source line selector (SLS) of the string of memory cell. The source line selector used herein can be also referred to "lower selector" or "bottom selector."

In some existing fabricating method of the 3D NAND memory device, the process includes forming an alternating dielectric stack comprising alternately stacked insulating layers and sacrificial layers, forming a channel hole by etching the alternating dielectric stack to the surface of the substrate, forming an epitaxial layer at the bottom of the channel hole by performing selective epitaxial growth, forming a memory layer in the channel hole, removing the sacrificial layers, forming a silicon oxide gate dielectric layer on the surface of the epitaxial layer by performing an oxidation process, and performing a metal filling process to form a metal gate around the epitaxial layer. As such, a source line selector device can be formed.

In the above process of forming the source line selector device, the selective epitaxial growth process requires a large amount of heat, and the temperature is usually greater than 800° C., which may affect the device formation of the peripheral circuits. Additionally, after etching the channel hole, the flatness of the surface of the substrate is poor, which affects the quality of the epitaxial growth and further affects the performance of the source line selector device.

Various embodiments in accordance with the present disclosure provide a 3D memory device with source line selector structure for a memory array. By etching the substrate to form an array of protruding islands, the channel region of the source line selectors can be formed without an epitaxial growth, thereby reducing the thermal requirement of the fabricating process. As such, the transistor channel performance of the 3D memory device, the switching performance of the source line selectors, and the device performance of the peripheral circuits can be ensured.

Figure 2:
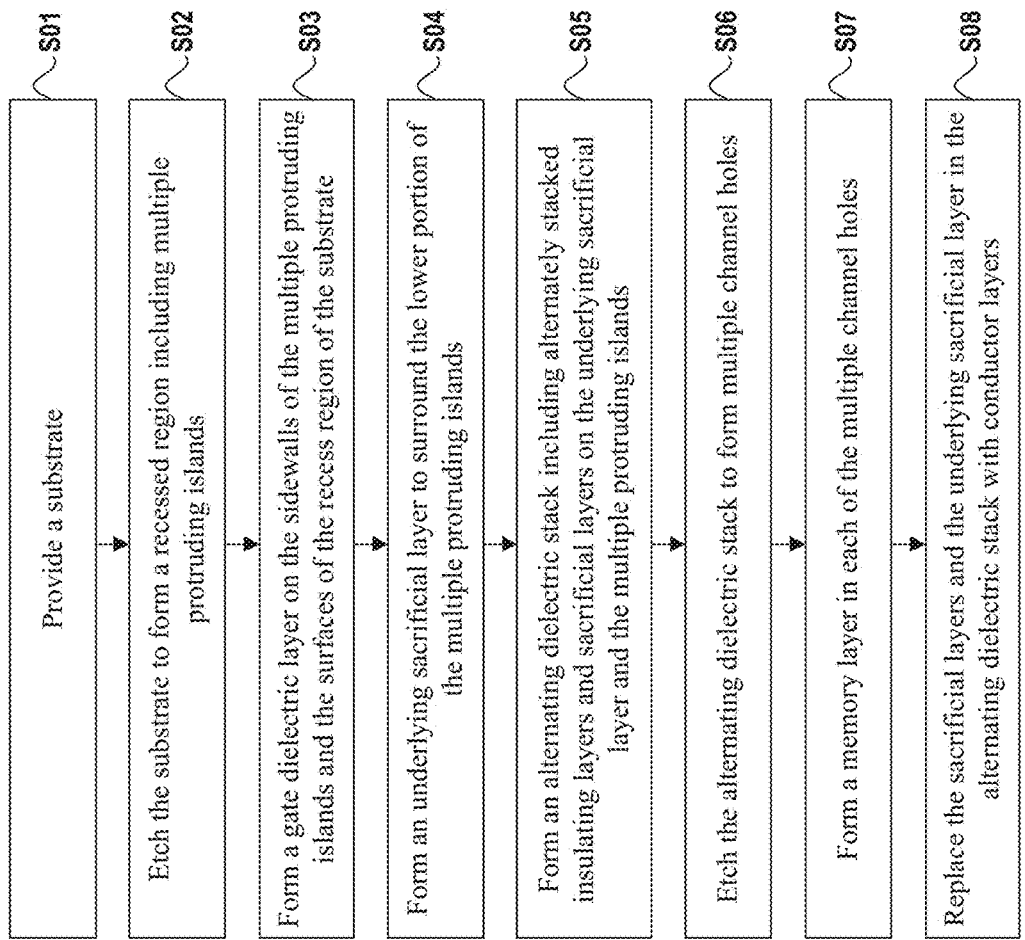
FIG. 2 illustrates a flowchart of an exemplary method for forming a 3D memory device in accordance with some embodiments of the present disclosure.

Referring to FIG. 2, a flowchart of an exemplary method 200 for forming a 3D memory device is illustrated in accordance with some embodiments of the present disclosure. FIGS. 3-17 illustrate schematic cross-sectional views and/or top views of an exemplary 3D memory device at certain fabricating stages of the method shown in FIG. 2.

As shown in FIG. 2, method 200 starts at operation S01, in which a substrate 100 can be provided. In some embodiments, the substrate can be any suitable semiconductor substrate having any suitable material and/or structure, such as a monocrystalline silicon single-layer substrate, a polycrystalline silicon (polysilicon) single-layer substrate, a polysilicon and metal multi-layer substrate, a germanium substrate, a silicon germanium (SiGe) substrate, a silicon on insulator (SOI) substrate, a germanium on insulator (GOI) substrate, a gallium arsenide (GaAs) substrate, an Indium phosphide (InP) substrate, a silicon carbide (SiC) substrate, a silicon and silicon germanium (Si/SiGe) multi-layer substrate, a silicon and germanium on insulator (SGOI) multi-layer substrate, etc. In the following description, the substrate 100 is a monocrystalline silicon substrate as an example.

In some embodiments, a core memory region and a peripheral circuit region can be integrated on the substrate 100. In some other embodiments, the substrate 100 can include the core memory region without the peripheral circuit region. The core memory region can be used to form memory cells of the 3D NAND device. The peripheral circuit region can be used to form one or more peripheral circuits related to the operations of the 3D NAND device. The peripheral circuits can include one or more complementary metal-oxide-semiconductor (CMOS) devices.

Figure 6:
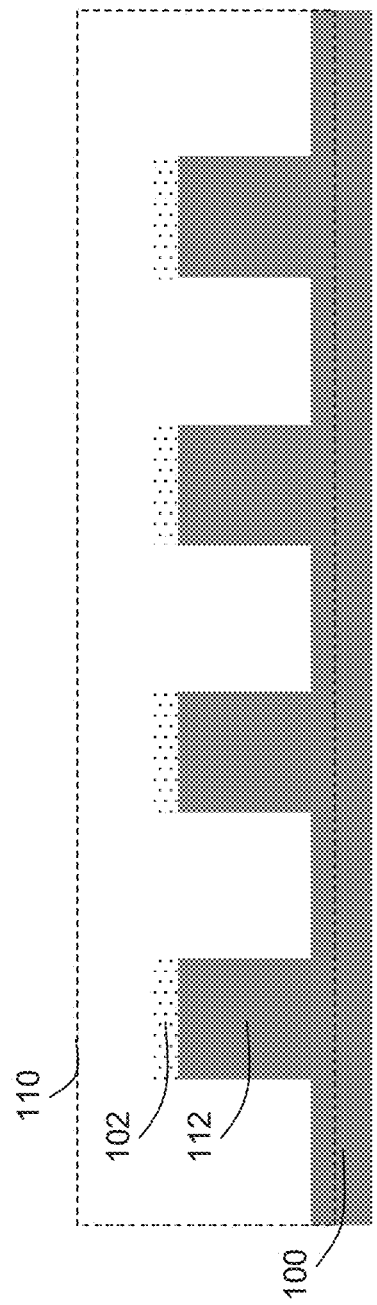

Referring to FIG. 2, method 200 processes to operation S02, in which the substrate 100 can be etched to form a recessed region 110 including an array of protruding islands 112, as shown in FIG. 6.

In some embodiments, the core memory region of the substrate 100 can be etched to form the recessed region 110. Multiple well doping regions can be formed in the core memory region of the substrate 100. Since the protruding islands 112 are formed by etching the substrate 100, the protruding islands 112 and the substrate 100 can have the same material and the same crystal structure. After the etching process, the remaining portion of the substrate 100 can form the protruding islands 112. The protruding islands 112 can be regularly arranged to form a protruding islands array. Each protruding islands 112 can correspond to a channel hole to be formed in subsequent processes. In some embodiments, each protruding structure 112 can have a cylindrical shape.

Specifically, forming the recessed region 110 including an array of protruding islands 112 can include the following processes.

Figure 3:
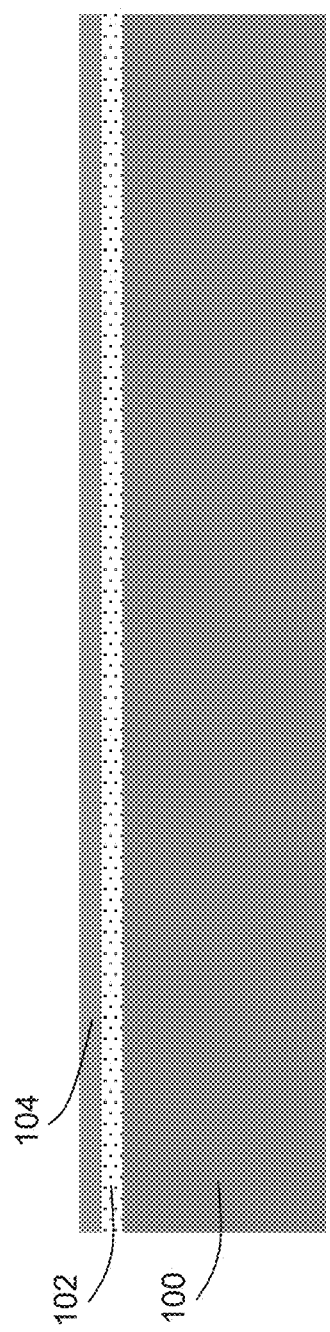
FIGS. 3-17 illustrate schematic cross-sectional views and/or top views of an exemplary 3D memory device at certain fabricating stages of the method shown in FIG. 2 according to some embodiments of the present disclosure.

In some embodiments, a first hard mask layer 102 and a first photoresist layer 104 can be sequentially formed on the substrate 100, as shown in FIG. 3. The first hard mask layer 102 include have a single layer structure or a multi-layer structure. The material of the first hard mask layer 102 can be silicon oxide, silicon nitride, silicon oxynitride, amorphous carbon, etc., or a combination thereof. The first photoresist layer 104 can be either positive photoresist or negative photoresist.

In some embodiments, the first hard mask layer 102 can include a silicon oxide layer, an amorphous carbon layer, and a silicon oxynitride layer. The first photoresist layer 104 can be a negative photoresist layer. The first hard mask layer 102 can be formed on the substrate 100 by performing a chemical vapor deposition or a thermal oxidation process. The first photoresist layer 104 can be formed by spin-coating a negative photoresist material on the first hard mask layer 102.

Figure 4:
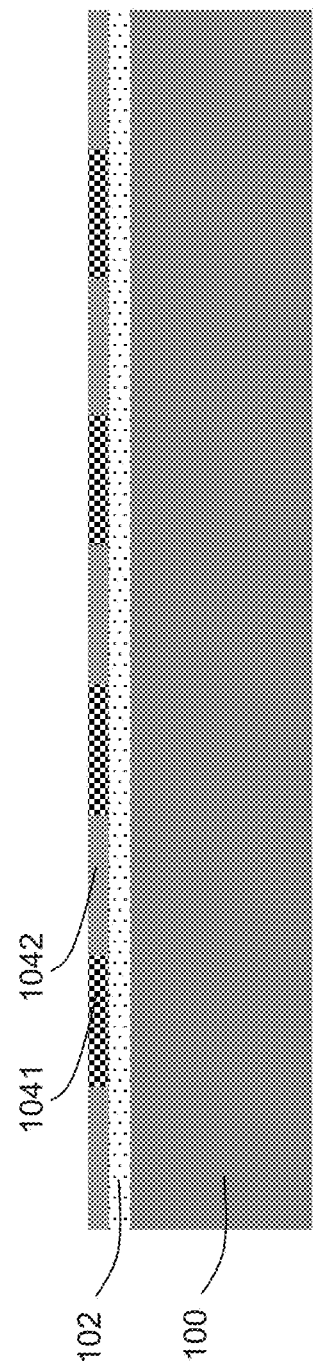

As shown in FIG. 4, a mask plate can be disposed on the first photoresist layer 104 and an exposure process can be performed to the first photoresist layer 104. As such, the pattern on the mask plate can be transferred to the first photoresist layer 104.

Figure 5:
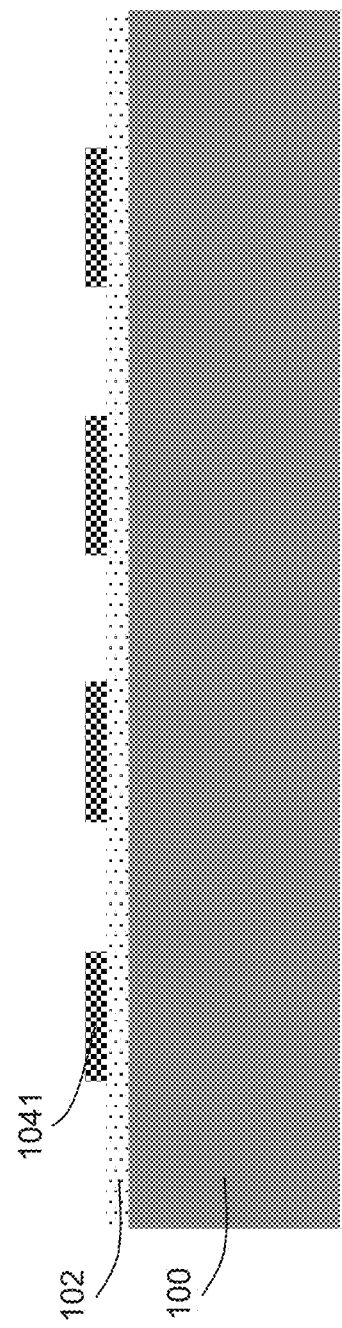

Since the first photoresist layer 104 is a negative photoresist layer, a portion of the first photoresist layer 1042 that is not irradiated can be removed during the development process, and the rest portion of the first photoresist layer 1041 that is irradiated can be remained during the development process to form a patterned first photoresist layer 1041, as shown in FIG. 5.

Using the patterned first photoresist layer 1401 as a mask, the first hard mask layer 102 can be patterned, as shown in FIG. 6. In some embodiments, a dry etching process, such as a reactive ion etching (RIE) process can be performed to etch the first hard mask layer 102. As such, the pattern of the photoresist layer 1401 can be transferred to the first hard mask layer 102. The patterned first photoresist layer 1041 can be cleaned and removed.

Figure 7:
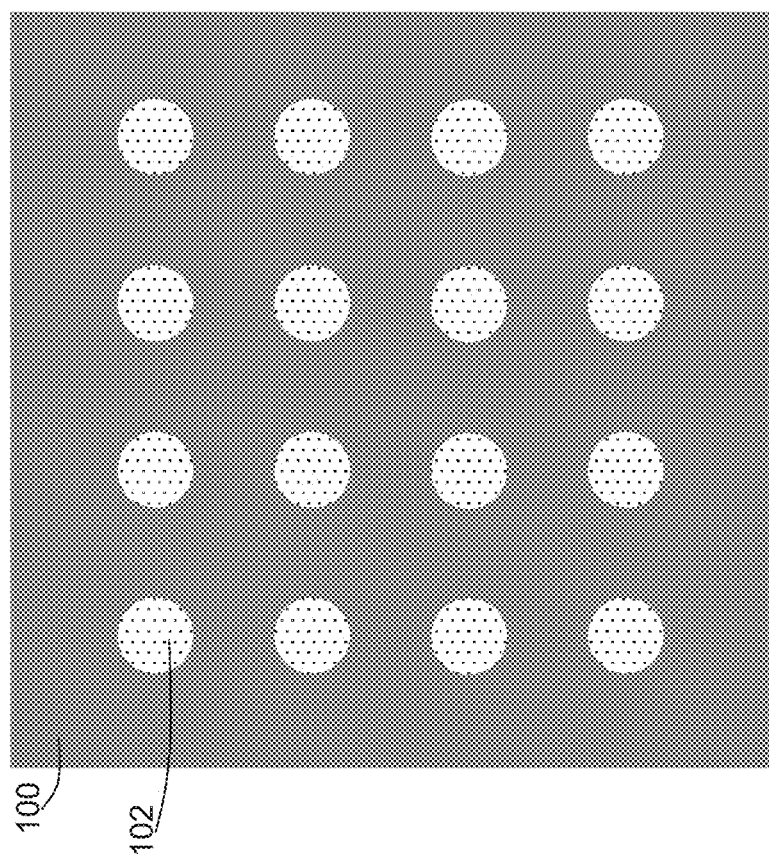

Using the patterned first hard mask layer 102 as a mask, the substrate 100 can be etched to form a recessed region 110 including an array of protruding islands 112, as shown in FIGS. 6 and 7, where FIG. 6 illustrates a cross-sectional view of the recessed region 110 of substrate 100 and FIG. 7 illustrates a top view of the recessed region 110 of substrate 100. As shown in FIG. 6, after the etching process, the removed portion of the substrate 100 can form the recessed region 110, while the unremoved portion of the substrate 100 can form multiple protruding islands 112. The multiple protruding islands 112 can be arranged in an array to form a protruding islands array, as shown in FIG. 7.

Since the array of protruding islands 112 are formed by etching the substrate 100, the array of protruding islands 112 can have the same material and the same crystal structure of the substrate 100. For example, in some embodiments, the material of the protruding islands 112 can be monocrystalline silicon. Without forming by using a growth process, the protruding islands 112 can provide a higher quality channel region for the source line selector device formed in the subsequent processes. As such, the performance of the formed source line selector device can be improved.

After the array of protruding islands 112 are formed, the first hard mask layer 102 on the array of protruding islands 112 can either be removed or be retained. In some embodiments as shown in FIG. 6, the first hard mask layer 102 is retained.

Each formed protruding island 112 can be a channel region of the source line selector formed in the subsequent processes. That is, a channel hole is to be formed above each protruding island 112. Thus, the mask plate used in the above etching process to transfer the pattern to the photoresist layer 104 can be used again to form the channel holes, thereby reducing the fabricating process cost.

Figure 8:
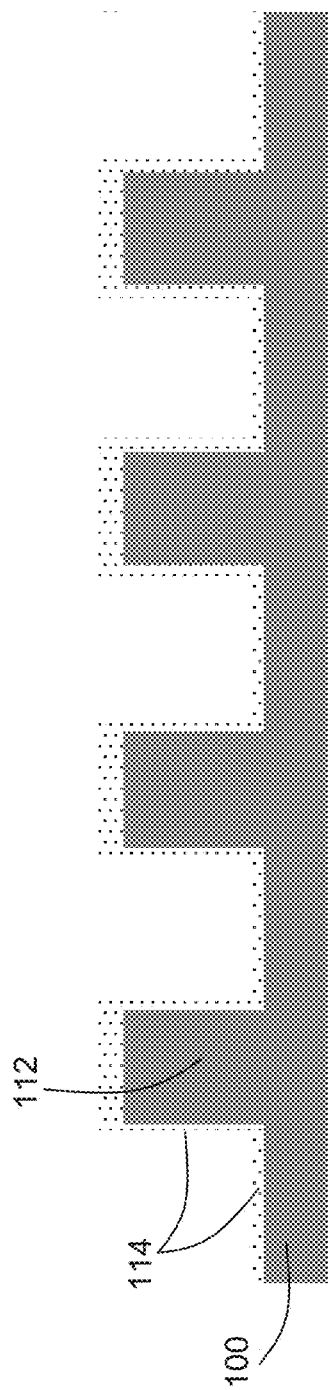

Referring to FIG. 2, method 200 processes to operation S03, in which a gate dielectric layer 114 can be formed on the sidewalls of the multiple protruding islands 112 and the surfaces of the recess region 110 of the substrate 100, as shown in FIG. 8.

Each protruding island 112 can be a channel region of the corresponding source line selector. A gate dielectric layer can be formed on the channel region of the source line selector, so as to form a channel selector later. The gate dielectric layer can include silicon dioxide or a high-k dielectric material having a higher dielectric constant relative to silicon dioxide. In some embodiments, the gate dielectric layer 114 is silicon dioxide formed by performing a thermal oxidation process. After the thermal oxidation process, the gate dielectric layer 114 can be formed to cover the exposed surfaces of the multiple protruding islands 112 and the recessed region 110 of the substrate 100. The gate dielectric layer 114 on the top surfaces of the multiple protruding islands 112 can be removed when the memory layer is subsequently formed.

Figure 11:
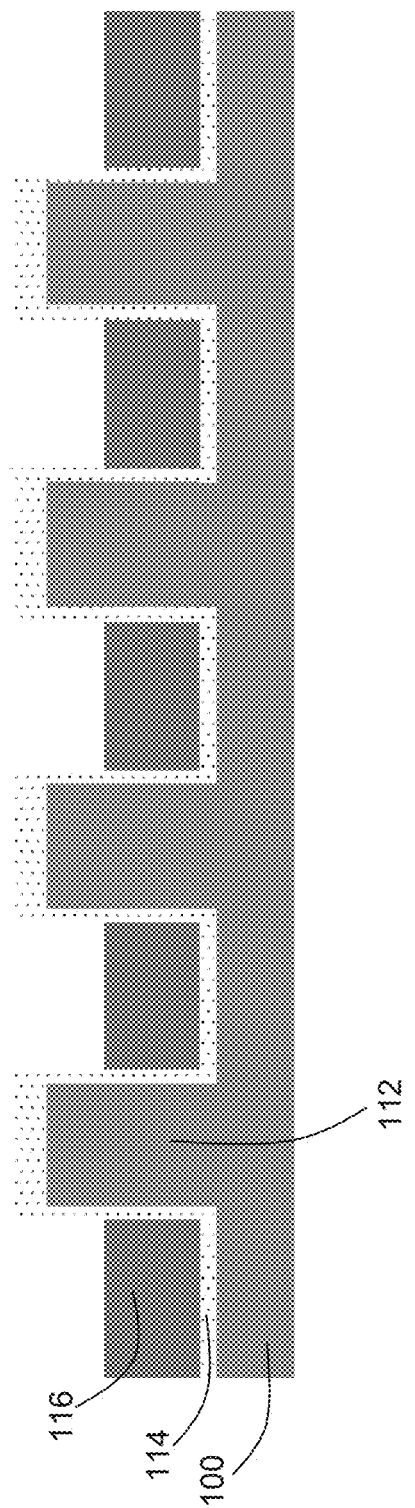

Referring to FIG. 2, method 200 processes to operation S04, in which an underlying sacrificial layer 116 can be formed to surround the lower portion of the multiple protruding islands 112, as shown in FIG. 11. The underlying sacrificial layer 116 can be formed on the gate dielectric layer 114 of the recess region 110 to surround the lower portion of the multiple protruding islands 112. That is, a top surface of the underlying sacrificial layer 116 is lower than the top surfaces of the multiple protruding islands 112, as shown in FIG. 11.

In some embodiments, the underlying sacrificial layer 116 can be removed in a subsequent process. And a metal layer can be refilled to occupy the position of the sacrificial layer 116. Thus, the refilled metal layer can surround the lower portion of the multiple protruding islands 112 to act as the gates of the source line selectors. The material of the underlying sacrificial layer 116 can be determined according to the etching selectivity properties when the underlying sacrificial layer 106 is subsequently removed. In some embodiments, the material of the sacrificial layer can be silicon nitride ($Si_3N_4$).

Figure 9:
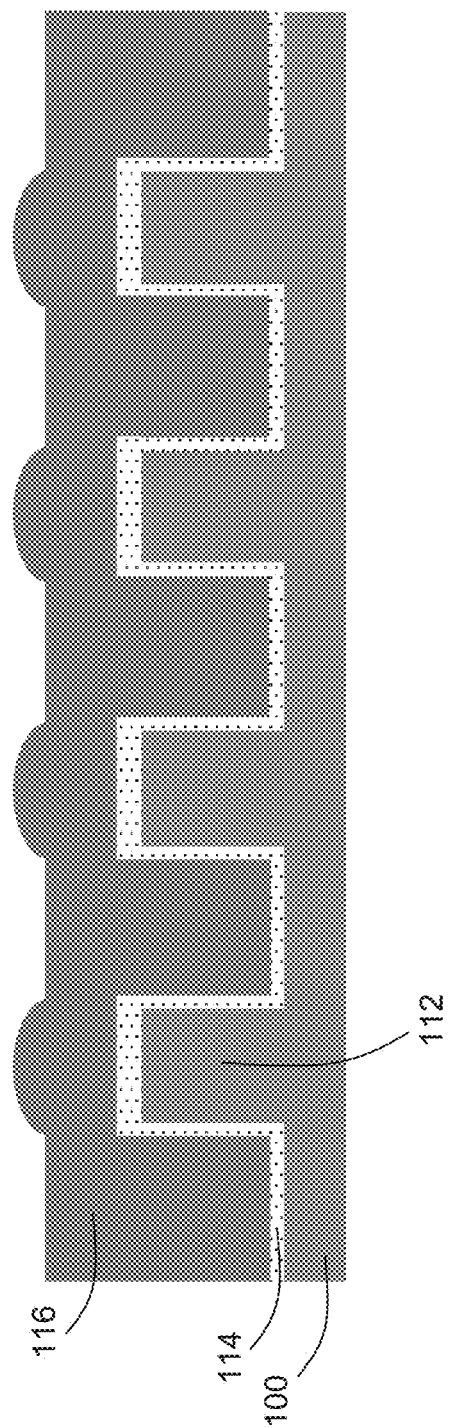
Figure 10:
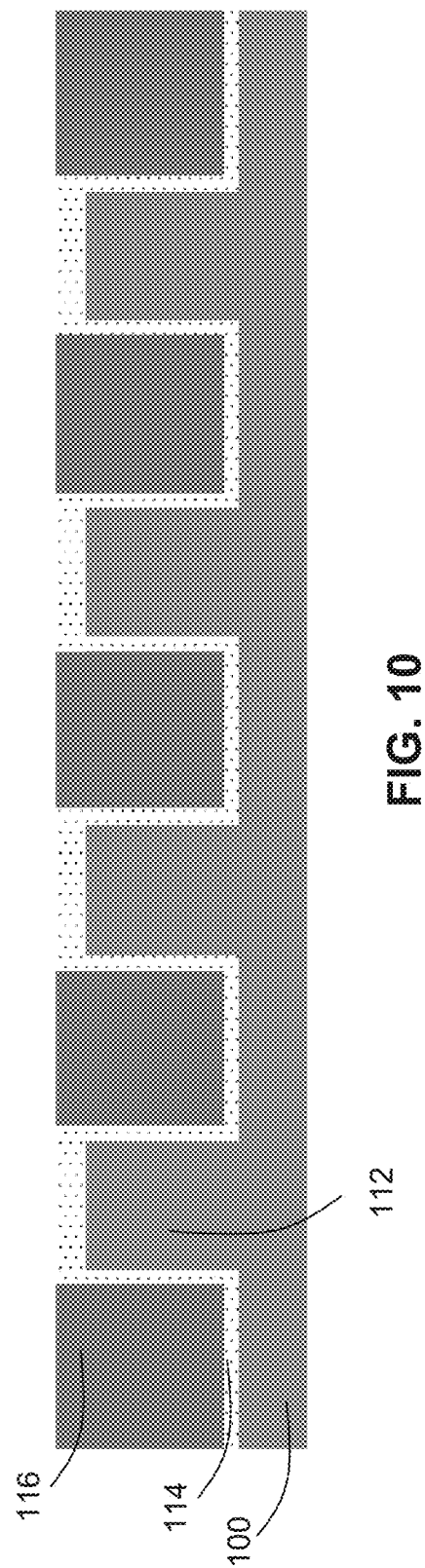

Specifically, the underlying sacrificial layer 116 can be formed by using the following processes. As shown in FIG. 9, the underlying sacrificial layer 116 can be deposited by using a chemical vapor deposition process or any other suitable deposition process. As shown in FIG. 10, the underlying sacrificial layer 116 can be planarized by performed a planarization process, such as a chemical mechanical polishing (CMP) process. As shown in FIG. 11, an upper portion of the underlying sacrificial layer 116 can be removed by performing an etching process, such as a dry etching process or a wet etching process. A predetermined thickness of the underlying sacrificial layer 116 can be etched, such that the remaining portion of the underlying sacrificial layer 116 can surround the lower portion of the multiple protruding islands 112. That is, the top surface of the underlying sacrificial layer 116 is lower than the top surfaces of the multiple protruding islands 112.

Figure 14:
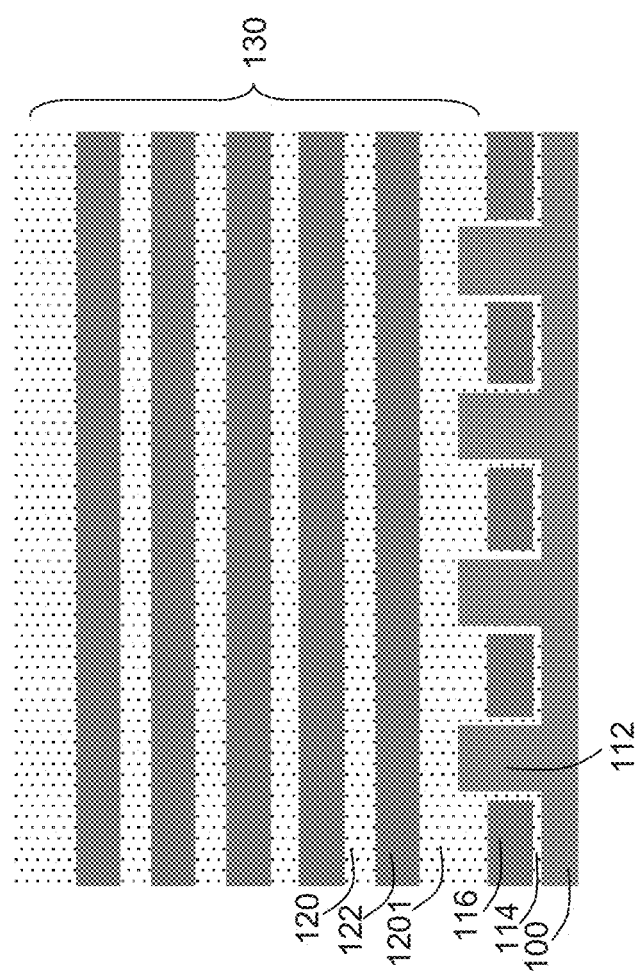

Referring to FIG. 2, method 200 processes to operation S05, in which an alternating dielectric stack 130 including alternately stacked insulating layers and sacrificial layers can be formed on the underlying sacrificial layer 116 and the multiple protruding islands 112, as shown in FIG. 14.

The number of layers of the alternating dielectric stack 130 can be determined according to the number of memory cells to be formed in the vertical direction. The number of layers of the alternating dielectric stack 130 can be 32, 64, 128, etc. In some embodiments, the number of layers of the alternating dielectric stack 130 refers to the number of sacrificial layers. The sacrificial layers can be replaced with conductor layers in the subsequent processes. The insulating layers are used to separate the conductor layers. The conductor layers can be used as the control gates of the 3D NAND memory device.

The number of layers of the alternating dielectric stack 130 can determine the number of memory cells in the vertical direction. Thus, a larger number of layers of the alternating dielectric stack 130 means a higher integration degree. It is noted that, in the figures, only a few layers are schematically shown as an illustrative example, and do not limit the scope of the present disclosure.

The material of the insulating layers and the sacrificial layers can be determined according to the etching selectivity properties in the subsequent processes. In some embodiments, each insulating layer can be a silicon oxide ($SiO_2$) layer, and each sacrificial layer can be a silicon nitride ($SiN_2$) layer.

Figure 12:
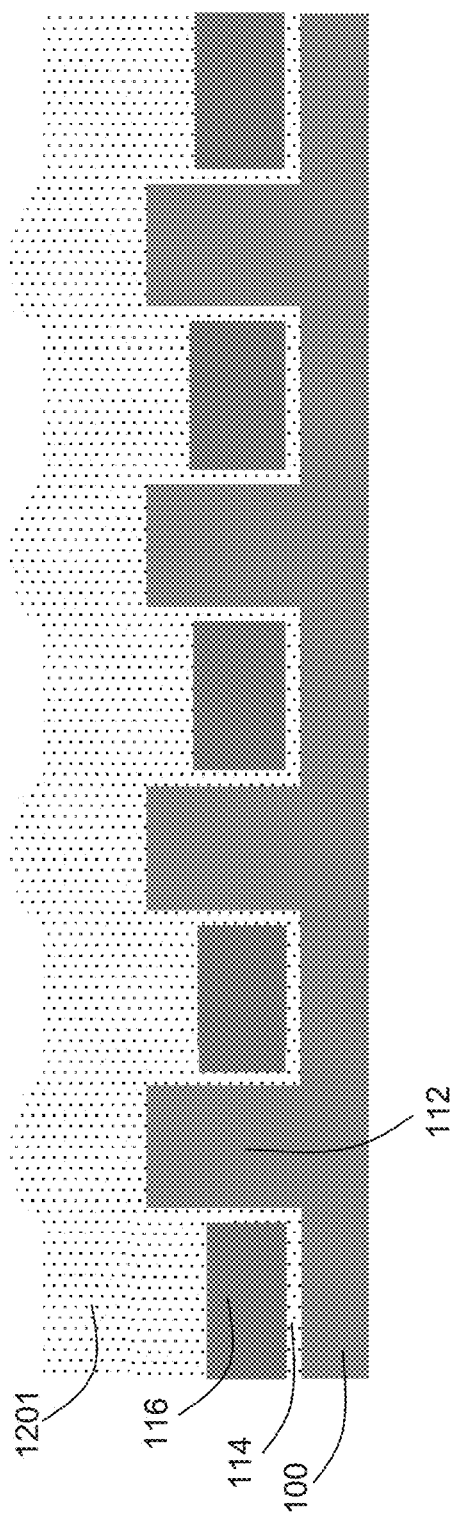

Specifically, the fabricating process for forming the alternating dielectric stack 130 can include the following processes. As shown in FIG. 12, a first insulating layer 1201 can be formed by performing a depositing process. For example, a chemical vapor deposition can be performed to fill silicon oxide to form the first insulating layer 1201.

Figure 13:
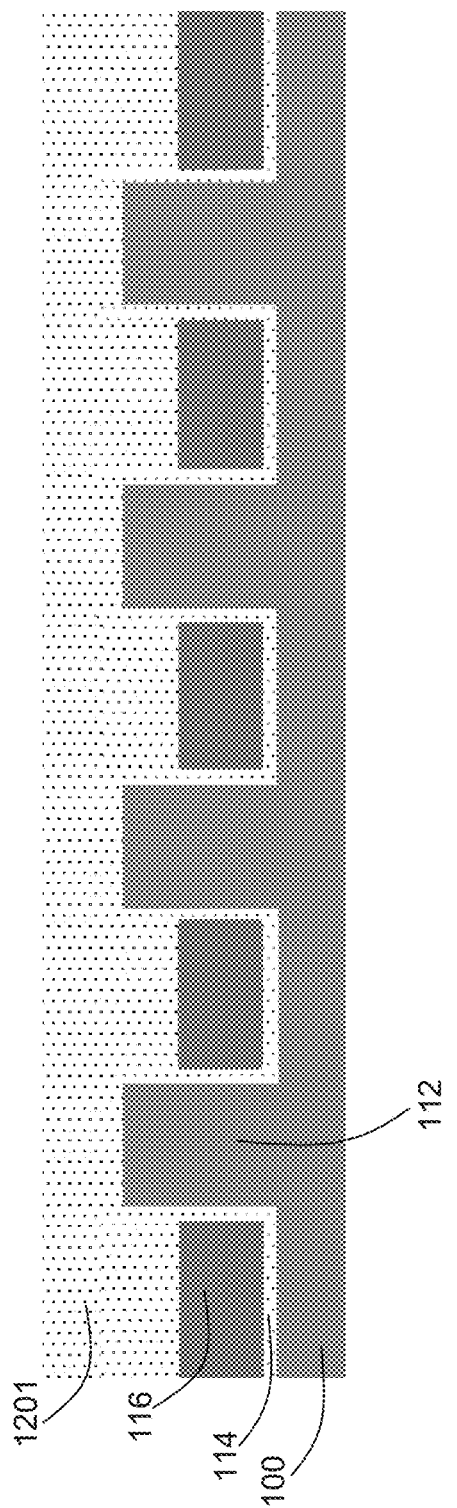

As shown in FIG. 13, a planarization process can be performed to planarize the first insulating layer 1201. The top surface of the first insulating layer 1201 can be higher than the top surfaces of the multiple protruding islands 112. An upper portion of the first insulating layer 1201 on the multiple protruding islands 112 can be removed to achieve planarization of the first insulating layer 1201. After the planarization process, the first insulating layer 1201 still covers the top surfaces of the multiple protruding islands 112. As such, the subsequent formation of stacked layers for forming the memory cells can be facilitated.

As shown in FIG. 14, multiple sacrificial layers 122 and multiple insulating layers 120 can be alternately stacked over the planarized first insulating layer 1201 to form the alternating dielectric stack 130. The sacrificial layers 122 and the insulating layers 120 can be formed by any suitable thin film deposition processes including, but not limited to, chemical vapor deposition (CVD), physical vapor deposition (PVD), atomic layer deposition (ALD), or any combination thereof.

Figure 15:
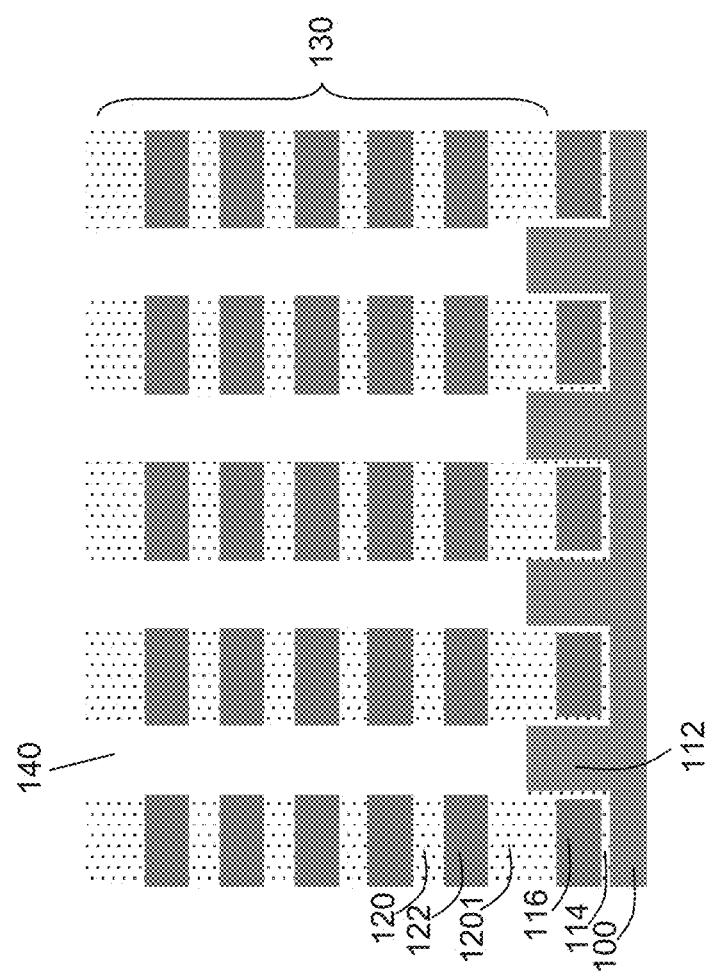

Referring to FIG. 2, method 200 processes to operation 506, in which the alternating dielectric stack 130 can be etched to form multiple channel holes 140, as shown in FIG. 15. Each channel hole 140 can correspond to one protruding island 112. The protruding island 112 can be a channel region of the source line selector. Each channel hole 140 can be used to form a memory layer that is connected with the corresponding protruding island 112.

Specifically, a second hard mask layer and a patterned second photoresist layer (not shown in the figures) can be sequentially formed on the alternating dielectric stack 130. The mask plate used for forming the multiple protruding islands 112 described above can be used again to form the patterned second photoresist layer. An etching process can be performed to transfer the pattern from the second photoresist layer to the second hard mask layer. The second photoresist layer can then be removed.

The alternating dielectric stack 130 can be etched by performing any suitable etching process, such as a reactive ion etching (RIE) process. The alternating dielectric stack 130 can be etched until the top surfaces of the multiple protruding islands 112 are exposed. As such, multiple channel holes 140 can be formed on the multiple protruding islands 112, as shown in FIG. 15. Each channel hole 140 is located on one protruding island 112 for forming a memory layer in the subsequent processes.

Figure 16:
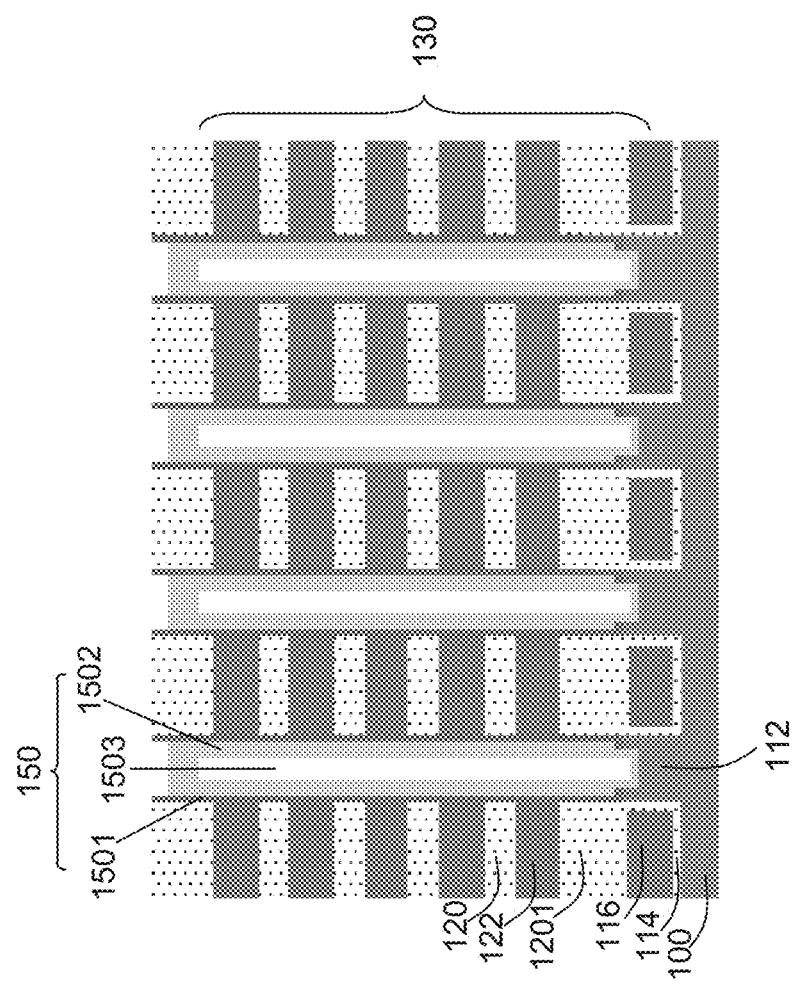

Referring to FIG. 2, method 200 processes to operation S07, in which a memory layer 150 can be formed in each of the multiple channel holes 140. As shown in FIG. 16, the memory layer 150 can include a charge trapping layer 1501 on the sidewall of the channel hole 140, a channel layer 1502 on the sidewall of the charge trapping layer 1501, and an insulating filler layer 1503 surrounded by the channel layer 1502.

In some embodiments, the charge trapping layer 1501 can be a composite dielectric layer, such as a combination of a tunneling layer, a storage layer, and a blocking layer. The tunneling layer can include dielectric materials including, but not limited to, silicon oxide, silicon nitride, silicon oxynitride, or any combination thereof. Electrons or holes from the channel layer 1502 can tunnel to a storage layer through the tunneling layer. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/ silicon nitride/silicon oxide (ONO). The blocking layer can further include a high-k dielectric layer, such as an aluminum oxide ($Al_2O_3$) layer. In some embodiments, the charge trapping layer 1501 can have a silicon oxide-silicon nitride-silicon oxide (ONO) structure.

After forming the charge trapping layer 1501 on the sidewalls of the multiple channel holes 140, the channel layer 1502 can be formed on the sidewalls of the charge trapping layer 1501. The material of the channel layer 1502 can be polysilicon. The charge trapping layer 1501 and the channel layer 1502 can be formed by using any thin film deposition processes, such as ALD, CVD, PVD, any other suitable processes, or any combination thereof. The channel layer 1502 can include semiconductor materials, such as polysilicon.

In some embodiments, before forming the channel layer 1502, the charge trapping layer 1501 formed on the top surface of the protruding island 112 in each channel hole 140 can be removed, such that the deposited channel layer 1502 can be in contact with the top surface of the protruding island 112 in each channel hole 140. The insulating filling layer 1503 can be filled into the gaps in each channel hole 140 that is surrounded by the channel layer 1502.

Figure 17:
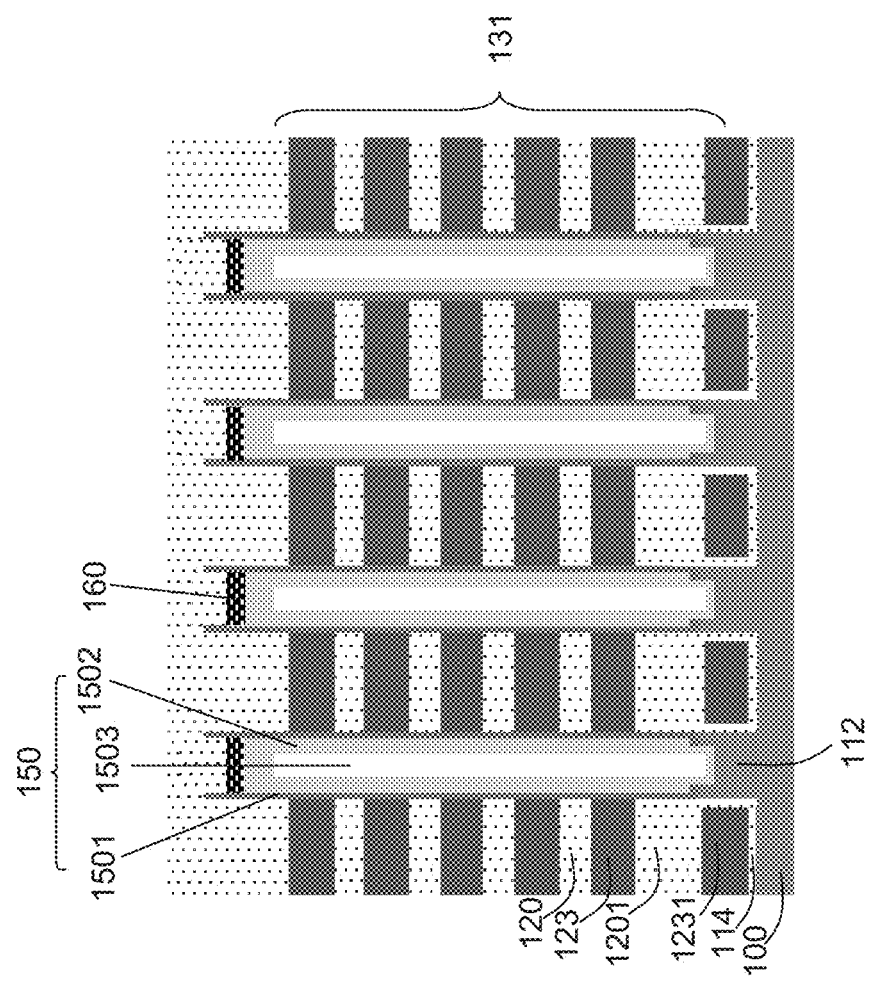

Referring to FIG. 2, method 200 processes to operation S08, in which the sacrificial layers 122 and the underlying sacrificial layer 116 in the alternating dielectric stack 130 can be replaced with conductor layers 123, as shown in FIG. 17.

In some embodiments, a gate replacement process (also known as the "word line replacement" process) can be performed to replace the sacrificial layers 122 and the underlying sacrificial layer 116 (e.g., silicon nitride layers) with conductive layers 123. Conductive layers 123 can include conductive materials including, but not limited to, W, Co, Cu, Al, polysilicon, silicides, or any combination thereof.

The replacement of the sacrificial layers 122 and the underlying sacrificial layer 116 with the conductive layers 123 can be performed by wet etching the sacrificial layers 122 and the underlying sacrificial layer 116 (e.g., silicon nitride) selective to the insulating layers 120 (e.g., silicon oxide) and filling the structure with conductive layers 123 (e.g., W). Conductive layers 123 can be filled by PVD, CVD, ALD, any other suitable process, or any combination thereof.

As a result, after the gate replacement process, the alternating dielectric stack 130 becomes an alternating conductor/dielectric stack 131. As shown in FIG. 17, the alternating conductor/dielectric stack 131 can include alternatively stacked conductor layers 123 and the insulating layers 120.

Specifically, one or more gate line slits (not shown in the figures) can be formed vertically penetrating the alternating dielectric stack 130. An acid liquid having a high selectivity ratio between the insulating layers 120 and the sacrificial layers 122 as well as the underlying sacrificial layer 116 can be used to fill into the one or more gate line slits. In some embodiments, phosphoric acid ($H_3PO_4$) can be used to remove the sacrificial layers 122 and the underlying sacrificial layer 116 that include silicon nitride material.

After the removal process, a conductor material, such as a metal material can be filled into the gaps between the insulating layers 120. In some embodiments, the metal material can be tungsten (W). Next, an N-type drain contact 160 can be formed in the upper portion of each channel hole 140 for connecting the drain selector. Further, an ion implantation process can be performed to form a drain contact 160 at the top portion of each channel hole 140.

After the gate replacement process and the ion implantation process, the conductor layers 123 can be used as the gate lines of the 3D NAND memory device. Each of the conductor layers 123 in the alternating conductor/dielectric stack 131 and the storage layer 150 can form a memory cell. That is, a string of memory cells can be formed in each channel hole 140. The source line selector can be located at the bottom of the string of memory cells. The channel of source line selector can be the protruding island 112. The gate dielectric layer 114 can be formed on the sidewall of the protruding island 112. The lower portion of the protruding island 112 can be surrounded by an underlying conductor layer 1231. The top surface of the protruding island 112 can be in contact with the storage layer 150.

The present disclosure further provides a 3D memory device formed by using the above disclosed fabricating method. As shown in FIG. 17, the 3D memory device can include a substrate 100 including a recessed region, and an array of protruding islands 112 disposed on the recessed region. A gate dielectric layer 114 is disposed on the sidewalls of the protruding island 112 and on the top surfaces of the recessed region of the substrate 100. The array of protruding island 112 can be formed by etching the substrate 100.

The 3D memory device can further include an underlying conductor layer 1231 that surrounds the sidewall of each of the array of protruding island 112. Since the underlying conductor layer 1231 can act as a bottom select gate (BSG) of a metal-oxide-semiconductor field-effect transistor (MOSFET), and each protruding island 112 can act as a selective epitaxial growth (SEG) of the MOSFET, a top surface of the underlying conductor layer 1231 can be lower than the top surface of each of the array of protruding island 112 to form a plurality of MOSFETs.

The 3D memory device can further include an alternating conductor/dielectric stack 131 on the underlying conductor layer 1231. The alternating conductor/dielectric stack 131 can include multiple alternately stacked insulating layers 120 and conductor layers 123. A bottom surface of the alternating conductor/dielectric stack 131 is lower than the top surfaces of the array of protruding island 112. The top surfaces of the array of protruding island 112 can be lower than the bottom surface of the lowest conductor layer in the alternating conductor/dielectric stack 131. In other words, a top surface of each protruding island 112 is lower than a top surface of a lowest insulating layer in the alternating conductor/dielectric stack 131. As such, a top surface of the formed SEG can be lower than the bottom surface of the lowest control gate to prevent short.

The 3D memory device can further include multiple channel holes vertically penetrating the alternating conductor/dielectric stack 131. Each channel hole can be located above one protruding island 112. In each channel hole, a storage layer 150 can be in contact with the protruding island 112. The protruding island 112 can act as a channel region of a source line selector.

In some embodiments, the storage layer 150 can include a charge trapping layer 1501 on the sidewall of the channel hole, an insulating filling layer 1503 in the middle of the channel hole, and a channel layer 1502 located between the charge trapping layer 1501 and the insulating filling layer 1503.

Various embodiments in accordance with the present disclosure provide a 3D memory device with smaller die size, higher device density, and improved performance. By vertically stacking the memory cells, the density of 3D memory devices can be increased. By etching the substrate to form an array of protruding islands, the channel region of the source line selectors can be formed without an epitaxial growth, thereby reducing the thermal requirement of the fabricating process. As such, the transistor channel performance of the 3D memory device, the switching performance of the source line selectors, and the device performance of the peripheral circuits can be ensured.

Accordingly, one aspect of the present discloses a method for forming a three-dimensional (3D) NAND memory device, comprising: forming a recess region in a substrate including a plurality of protruding islands; forming a gate dielectric layer to cover top surfaces and sidewalls of the plurality of protruding islands and a top surface of the recess region of the substrate; forming an underlying sacrificial layer on the gate dielectric layer to surround the sidewalls of the plurality of protruding islands; forming an alternating dielectric stack including a plurality of alternatively stacked insulating layers and sacrificial layers on the underlying sacrificial layer and the plurality of protruding islands; forming a plurality of channel holes penetrating the alternating dielectric stack, each channel hole is located corresponding to one of the plurality of protruding islands; and forming a memory layer in each channel hole, wherein a channel layer of the memory layer is electrically connected with a corresponding protruding island.

In some embodiments, forming the recess region in the substrate including the plurality of protruding islands comprises: forming a hard mask layer on the substrate; forming a patterned photoresist layer on the hard mask layer; using the patterned photoresist layer as a mask to pattern the hard mask layer; and using the patterned hard mask layer as a mask to etch the substrate to form the recess region including the plurality of protruding islands.

In some embodiments, forming the recess region in the substrate including the plurality of protruding islands comprises: etching the substrate to form the recess region including an array of protruding islands.

In some embodiments, forming the underlying sacrificial layer on the gate dielectric layer to surround the sidewalls of the plurality of protruding islands comprises: filling the underlying sacrificial layer to bury the plurality of protruding islands; planarizing the underlying sacrificial layer; and removing a top portion of the underlying sacrificial layer, such that a top surface of the remaining underlying sacrificial layer is lower than the top surfaces of the plurality of protruding islands.

In some embodiments, forming the alternating dielectric stack on the underlying sacrificial layer and the plurality of protruding islands comprises: depositing a first insulating layer on the underlying sacrificial layer to bury the plurality of protruding islands; planarizing the first insulating layer, such that a top surface of the remaining first insulating layer is higher than the top surfaces of the plurality of protruding islands; and forming a plurality of alternating sacrificial layers and insulating layers on the first insulating layer.

In some embodiments, forming the memory layer in each channel hole comprises: forming a charge trapping layer on a sidewall of each channel hole; forming a channel layer in contact with a protruding island on a sidewall of the charge trapping layer; and forming an insulation filling layer to fill a gap in the channel layer.

In some embodiments, the method further comprises replacing the underlying sacrificial layer and the sacrificial layers in the alternating dielectric stack with conductor layers.

In some embodiments, replacing the underlying sacrificial layer and the sacrificial layers in the alternating dielectric stack with conductor layers comprises: forming one or more slits vertically penetrating the alternating dielectric stack; etching the underlying sacrificial layer and the sacrificial layers through the one or more slits; and filling a conductor material into the gaps between the insulating layers.

In some embodiments, etching the underlying sacrificial layer and the sacrificial layers through the one or more slits comprises: filling an acid liquid having a high selectivity ratio between the insulating layers and the sacrificial layers into the one or more slits.

In some embodiments, the method further comprises forming a drain contact at a top portion of each channel hole, such that the protruding island acts as a channel region of a source line selector at a bottom portion of each channel hole.

Another aspect of the present disclosure provides a three-dimensional (3D) NAND memory device, comprising: a substrate including a plurality of protruding islands in a recess region of the substrate; a gate dielectric layer covering top surfaces and sidewalls of the plurality of protruding islands and a top surface of the recess region of the substrate; an underlying conductor layer on the gate dielectric layer to surround the sidewalls of the plurality of protruding islands; an alternating conductor/dielectric stack including a plurality of alternatively stacked insulating layers and conductor layers on the underlying conductor layer and the plurality of protruding islands; a plurality of channel holes vertically penetrating the alternating conductor/dielectric stack, each channel hole is above one protruding island; and a memory layer in each channel hole, wherein a channel layer of the memory layer is electrically connected with a corresponding protruding island.

In some embodiments, the plurality of protruding islands is formed by etching the substrate.

In some embodiments, the plurality of protruding islands is arranged in an array.

In some embodiments, a height of the underlying conductor layer is lower than a height of each protruding island.

In some embodiments, a top surface of the underlying conductor layer is lower than a top surface of each protruding island.

In some embodiments, a top surface of each protruding island is lower than a top surface of a lowest insulating layer in the alternating conductor/dielectric stack.

In some embodiments, the insulating layers comprise silicon oxide.

In some embodiments, the underlying conductor layer and the conductor layers comprise tungsten.

In some embodiments, the memory layer in each channel hole comprises: a charge trapping layer on a sidewall of each channel hole; a channel layer in contact with a protruding island on a sidewall of the charge trapping layer; and an insulation filling layer filling a gap in the channel layer.

In some embodiments, the device further comprises a drain contact at a top portion of each channel hole. The protruding island acts as a channel region of a source line selector at a bottom portion of each channel hole.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) NAND memory device, comprising:
    a substrate including a plurality of monolithic protruding islands in a recess region of the substrate;
    a gate dielectric layer completely covering sidewalls of the plurality of protruding islands and a top surface of the recess region of the substrate, wherein the gate dielectric layer is a continuous piece;

an underlying conductor layer contacting the gate dielectric layer in both a lateral direction and a vertical direction, and surrounding the sidewalls of the plurality of protruding islands in a lateral plane;

an alternating conductor/dielectric stack including a plurality of alternatively stacked insulating layers and conductor layers on the underlying conductor layer and the plurality of protruding islands;

a plurality of channel holes vertically penetrating the alternating conductor/dielectric stack, each channel hole is above one protruding island; and a memory layer in each channel hole, wherein a channel layer of the memory layer is electrically connected with a corresponding protruding island.

2. The device of claim 1, wherein the plurality of protruding islands is formed by etching the substrate.

3. The device of claim 1, wherein the plurality of protruding islands is arranged in an array.

4. The device of claim 1, wherein a height of the underlying conductor layer is lower than a height of each protruding island.

5. The device of claim 1, wherein a top surface of the underlying conductor layer is lower than a top surface of each protruding island.

6. The device of claim 1, wherein a top surface of each protruding island is lower than a top surface of a lowest insulating layer in the alternating conductor/dielectric stack.

7. The device of claim 1, wherein the insulating layers comprise silicon oxide.

8. The device of claim 1, wherein the underlying conductor layer and the conductor layers comprise tungsten.

9. The device of claim 1, wherein the memory layer in each channel hole comprises:

a charge trapping layer on a sidewall of each channel hole;

a channel layer in contact with a protruding island on a sidewall of the charge trapping layer; and an insulation filling layer filling a gap in the channel layer.

10. The device of claim 1, further comprising:

a drain contact at a top portion of each channel hole;

wherein each of the plurality of protruding islands acts as a channel region of a source line selector at a bottom portion of each channel hole.

* * * * *